(12) United States Patent
Kim et al.

(10) Patent No.: US 7,460,417 B2
(45) Date of Patent: Dec. 2, 2008

(54) SEMICONDUCTOR DEVICE, SEMICONDUCTOR MEMORY DEVICE AND DATA STROBE METHOD

(75) Inventors: Joung-Yeal Kim, Yongin-si (KR); Kwang-Il Park, Yongin-si (KR); Sung-Hoon Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 251 days.

(21) Appl. No.: 11/371,831

(22) Filed: Mar. 9, 2006

(65) Prior Publication Data

US 2006/0203573 A1    Sep. 14, 2006

(30) Foreign Application Priority Data

Mar. 14, 2005   (KR) .................. 10-2005-0020913

(51) Int. Cl.
*G11C 7/00* (2006.01)

(52) U.S. Cl. .................. 365/193; 365/233; 365/191

(58) Field of Classification Search ............... 365/193, 365/233, 189.01, 189.05, 230.08, 191, 239, 365/189.07

See application file for complete search history.

(56) References Cited

U.S. PATENT DOCUMENTS

| | | | |
|---|---|---|---|
| 6,215,710 B1 * | 4/2001 | Han et al. | 365/193 |
| 6,288,971 B1 * | 9/2001 | Kim | 365/233.1 |
| 6,940,321 B2 * | 9/2005 | Heo et al. | 327/112 |
| 6,950,370 B2 * | 9/2005 | Lee | 365/233 |
| 2005/0088906 A1 * | 4/2005 | Kim | 365/233 |

FOREIGN PATENT DOCUMENTS

| | | |
|---|---|---|
| JP | 07-182864 | 7/1995 |
| KR | 10-0307798 | 8/2001 |
| KR | 10-2004-0093858 | 11/2004 |

* cited by examiner

*Primary Examiner*—Dang T Nguyen
(74) *Attorney, Agent, or Firm*—Mills & Onello LLP

(57) ABSTRACT

Semiconductor devices having an interface of an open drain or a pseudo-open drain type are provided, and the semiconductor devices include a data strobe (DQS) control signal generating circuit, a DQS control circuit and an output unit. The generating circuit generates a first DQS control signal and a second DQS control signal, and the control circuit controls a data strobe signal by sequentially changing a state of a following section next to a postamble section of the data strobe signal in response to a clock signal; the first and second DQS control signals, from a first logical state of the postamble section to a second logical state, and then from the second logical state to a high impedance state after a first predetermined time. Operations at a high frequency may be possible by controlling a data strobe signal. Related controlling methods are provided.

29 Claims, 11 Drawing Sheets

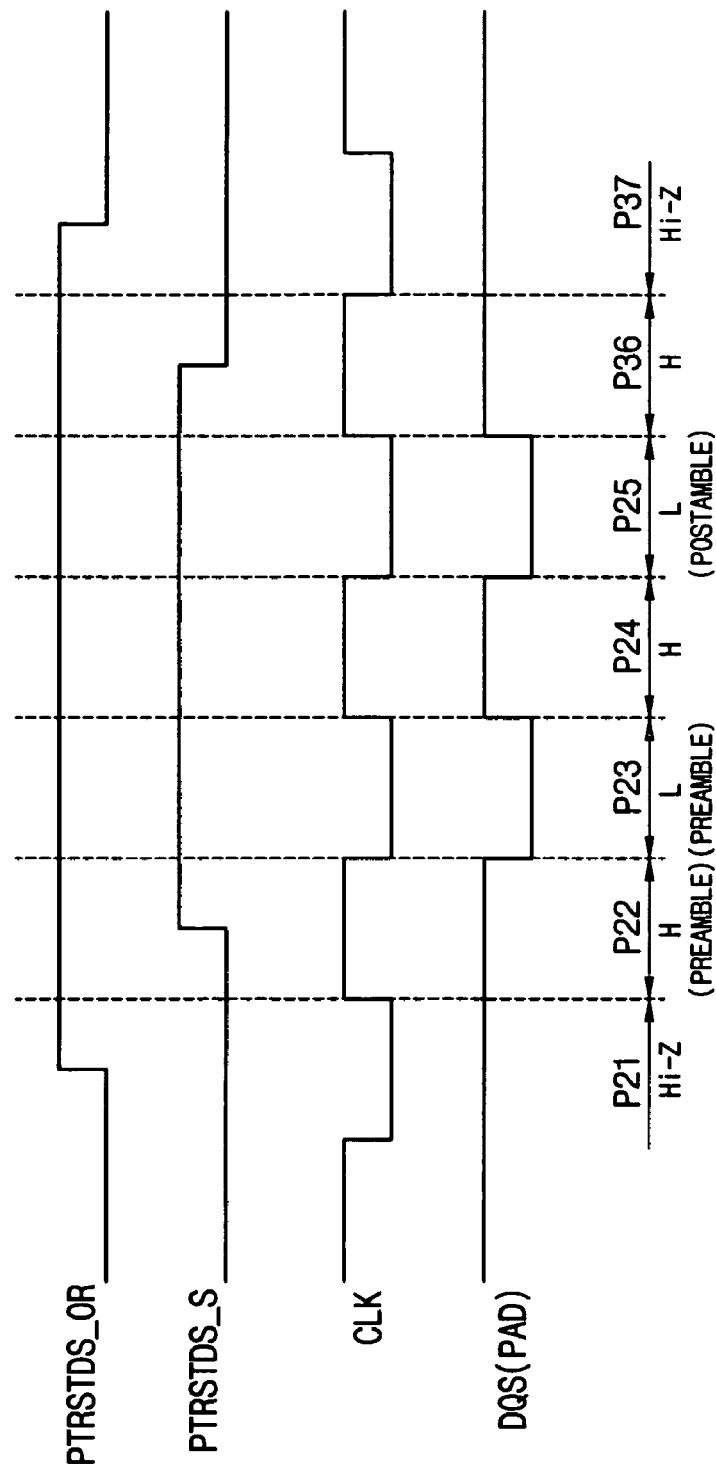

SEMICONDUCTOR DEVICE, SEMICONDUCTOR MEMORY DEVICE AND DATA STROBE METHOD

CROSS-REFERENCE TO RELATED APPLICATIONS

This application claims the benefit under 35 U.S.C. § 119(a) of Korean Patent Application No. 2005-0020913 filed on Mar. 14, 2005, the contents of which are herein incorporated by reference in its entirety.

BACKGROUND OF THE INVENTION

1. Field of the Invention

The present invention relates to semiconductor devices and methods of controlling a data strobe thereof, and more particularly to semiconductor memory devices having an interface of an open drain type or a pseudo-open drain type and methods of controlling a data strobe thereof.

2. Description of the Related Art

In a more advanced memory system than a double data rate (DDR) memory system, a data strobe signal (hereinafter referred to as a data strobe signal DQS) is typically used for an input/output of data. When a READ command is executed in a dynamic random access memory (DRAM), data synchronized to the data strobe signal DQS are outputted. The data strobe signal DQS has a preamble section and a postamble section. In a data output section, the data strobe signal DQS toggles between a logic level 'L' and a logic level 'H'.

FIG. 1 is a timing diagram illustrating a preamble section and a postamble section of a data strobe signal DQS in a common DDR3 memory.

Referring to FIG. 1, when a column address is activated according to a READ command, data is read after a predetermined column address strobe (CAS) latency (CL, for example CL=8). The data strobe signal DQS remains in a high-impedance level Hi-Z during a normal period. The data strobe signal DQS, however, has a preamble section (section A in FIG. 1) which maintains a low level by one clock in advance before reading data. After the preamble section, the data strobe signal DQS toggles according to a data read timing. The data strobe signal DQS has a postamble section (section B in FIG. 1) after a data read section, and then returns back to the high impedance level Hi-Z.

In the case of a semiconductor device having an input/output interface of an open drain type or a pseudo-open drain type, for example, a DDR3 memory, the high impedance level Hi-Z of the data strobe signal DQS corresponds to a high level H.

In the postamble section of the data strobe signal DQS with which the READ operation is finished, the data DQ and the data strobe signal DQS maintain the high impedance level Hi-Z and attain a level VDDQ by a termination voltage.

States of a DQS pin in a postamble section and a subsequent section next to the postamble section are shown in Table 1.

TABLE 1

| | Low Section of CLK (Postamble Section) | High Section of Next CLK (Following Section Next to Postamble Section) |
|---|---|---|
| DQS Output State | L | Hi-Z |
| DQS Pin Level | L | VDDQ |

FIG. 2 is a graph illustrating a ringing effect of a DQS pin voltage. A DQS input impedance has a nearly infinite value, and a total reflection occurs. A reflected wave due to the above impedance mismatch causes the ringing effect or ripples of the DQS pin voltage as shown in FIG. 2.

FIG. 3 is a block diagram illustrating a DQS output circuit of a conventional memory device, and FIG. 4 is a block diagram illustrating a DQS control signal generating circuit of a conventional memory device. FIG. 5 is a timing diagram illustrating a preamble section and a postamble section of a DQS output circuit of a conventional memory device.

Circuits similar to that illustrated in FIG. 3 are used for outputting a data strobe signal DQS according to a proper timing. The signals PTRSTDS_F and PTRSTDS_S are DQS control signals for toggling the data strobe signal DQS in the READ operation of the memory device. The signal PTRSTDS_S may be delayed by a ½ clock with respect to the signal PTRSTDS_F.

The DQS output circuit includes a first control circuit 310, a second control circuit 320, a p-channel metal oxide semiconductor (PMOS) transistor PT1 and an n-channel metal oxide semiconductor (NMOS) transistor NT1 as shown in FIG. 3.

Referring to FIGS. 3 and 5, the first control circuit 310 turns on the PMOS transistor PT1 and causes a DQS pin (PAD) to be in a high state H when both the signal PTRSTDS_F and a clock signal CLK are in a high state in sections P12 and P14. The first control circuit 310 may be realized by using the signal PTRSTDS_F and the signal CLK as inputs of an AND gate. In addition, the first control circuit 310 may be realized so that the signal PTRSTDS_F may be prefetched during a low ('L') section of the clock signal CLK and may be outputted during a high ('H') section of the clock signal CLK.

The second control circuit 320 turns on the NMOS transistor PT1 and causes the DQS pin (PAD) to be in a low state when the signal PTRSTDS_F is in a high state and a clock signal CLK is in a low state in sections P13 and P15.

When both the first control circuit 310 and the second control circuit 320 do not operate, both the NMOS transistor NT1 and the PMOS transistor PT1 are turned off. As a result, the state of the DQS pin becomes the high impedance state Hi-Z in sections P11 and P16.

Referring to FIG. 4, a DQS control signal LATENCYDS that controls a timing point of outputting READ data based on the CL is fetched according to a clock signal CLK. The signal LATENCYDS passes through delay circuits 407 and 409 to generate the signals PTRSTDS_S and PTRSTDS_F.

When the ringing effect occurs as shown in FIG. 2, a problem of accepting invalid data occurs in the semiconductor memory device, which accesses the data by counting a number of DQS togglings. In addition, the ringing effect itself may increase a noise level of a controller board, and may cause a limitation to an operation speed, and more particularly in a high frequency operation.

SUMMARY OF THE INVENTION

Accordingly, the present invention is provided to substantially obviate one or more problems due to limitations and disadvantages of the related art.

Some embodiments of the present invention provide semiconductor devices, and more particularly semiconductor devices having an input/output interface of an open drain type or a pseudo-open drain type, which reduce a ringing effect that occurs in a postamble section of a data strobe signal DQS.

Other embodiments of the present invention provide semiconductor memory devices having an input/output interface of an open drain type or a pseudo-open drain type, which may reduce a ringing effect that occurs in a postamble section of a data strobe signal DQS.

Still other embodiments of the present invention provide methods of controlling a data strobe by using the above semiconductor devices.

In some embodiments of the present invention, a semiconductor device having an interface of an open drain type or a pseudo-open drain type includes a data strobe (DQS) control signal generating circuit that generates a first DQS control signal and a second DQS control signal. The semiconductor device further includes a DQS control circuit that controls a data strobe signal DQS by sequentially changing a state of a following section next to a postamble section of the data strobe signal DQS in response to a clock signal, the first DQS control signal and the second DQS control signal. The state of the following section is changed from a first logical state of the postamble section to a second logical state and from the second logical state to a high impedance state after a first predetermined time. In addition, the memory device includes an output unit configured to output the data strobe signal DQS.

In further embodiments of the present invention, the first DQS control signal may be activated for a second predetermined time while the clock signal is activated during the following section next to the postamble section. The DQS control signal generating circuit may generate the second DQS control signal by latching a third DQS control signal in response to the clock signal and an inverted clock signal having an inverted phase with respect to the clock signal, and then by delaying the third DQS control signal for a first delay time. The first DQS control signal may be generated by executing an OR operation of the third DQS control signal and a fourth DQS control signal, the fourth DQS control signal being generated by latching the third DQS control signal and by delaying the third DQS control signal for a second delay time. In these embodiments, the first predetermined time may correspond to a half period of the clock signal.

In further embodiments of the present invention, the DQS control signal generating circuit may include a first latch for latching the third DQS control signal, a second latch for latching an output of the first latch, a third latch for latching an output of the second latch, and a first delay circuit for delaying an output of the third latch for the first delay time to output the second DQS control signal. The DQS control signal generating circuit may further include a second delay circuit for delaying the output of the second latch for a second delay time to output a fourth DQS control signal, and an OR gate executing an OR operation of the third DQS control signal and the fourth DQS control signal to output the first DQS control signal. Alternatively, the DQS control signal generating circuit may further include an OR gate executing an OR operation of the output of the second latch and the output of the third latch, and a second delay circuit for delaying an output of the OR gate for a second delay time to output the first DQS control signal. Alternatively, the DQS control signal generating circuit may further comprise an OR gate executing an OR operation of the output of the first latch and the output of the third latch, a fourth latch for latching an output of the OR gate, and a second delay circuit for delay an output of the fourth latch for a second delay time to output the first DQS control signal. The first predetermined time may be greater than a half period of the clock signal.

Further embodiments of the present invention provides a semiconductor device, in which the DQS control circuit may include a first DQS control circuit for maintaining the second logic state of the postamble section of the data strobe signal while both the first DQS control signal is activated and the clock signal is activated, and a second DQS control circuit for maintaining the first logic state of the postamble section of the data strobe signal while the second DQS control signal is activated and the clock signal is not activated. The first DQS control circuit may include a NAND gate for executing a NAND operation of the first DQS control signal and the clock signal. The first DQS control circuit may include a transmission gate for transmitting the first DQS control signal in response to an inverted clock signal having an inverted phase with respect to the clock signal, and a NAND gate for executing a NAND operation of the clock signal and an output of the transmission gate. In addition, the second DQS control signal may include an AND gate for executing an AND operation of the first DQS control signal and an inverted clock signal having an inverted phase with respect to the clock signal. The semiconductor device may correspond to a double data rate 3 (DDR3) memory device.

In some embodiments of the present invention, a semiconductor memory device having an interface of an open drain type or a pseudo-open drain type include a data strobe (DQS) control circuit for controlling a data strobe signal by sequentially changing a state of a following section next to a postamble section of the data strobe signal in response to a clock signal, the first DQS control signal and the second DQS control signal. The state is changed from a first logical state of the postamble section to a second logical state, and then from the second logical state to a high impedance state after a first predetermined time. The semiconductor memory device further includes an output unit for outputting the data strobe signal.

In further embodiments of the present invention, the semiconductor memory device may further include a DQS control signal generating circuit for generating a first DQS control signal and a second DQS control signal, in which the first DQS control signal is activated for a second predetermined time while the clock signal is activated during the following section next to the postamble section. The DQS control signal generating circuit may latch a third DQS control signal in response to the clock signal and an inverted clock signal having an inverted phase with respect to the clock signal, and outputs the second DQS control signal by delaying the third DQS control signal for a first delay time. In addition, the first DQS control signal may be generated by executing an AND operation of the third DQS control signal and a fourth DQS control signal, the fourth DQS control signal being generated by latching the third DQS control signal and by delaying the third DQS control signal for a second delay time.

In some embodiments of the present invention, a method of controlling a data strobe (DQS) is provided. The method may be used in a semiconductor device having an interface of an open drain type or a pseudo-open drain type. According to the method, a first DQS control signal and a second DQS control signal are generated. The first DQS control signal is activated for a second predetermined time while the clock signal is activated during a following section next to a postamble section of a data strobe signal. A state of the following section next to the postamble section of the data strobe signal is changed in response to a clock signal, the first DQS control signal and the second DQS control signal, from a first logical state of the postamble section to a second logical state, and the state of the following section next to the postamble section of the data strobe signal is changed from the second logical state to a high impedance state after a first predetermined time.

In further embodiments of the present invention, the second DQS control signal may be generated by latching a third DQS control signal in response to the clock signal and an inverted clock signal having an inverted phase with respect to the clock signal, and then by delaying the third DQS control signal for a first delay time. In addition, the first DQS control signal may be generated by executing an OR operation of the third DQS control signal and a fourth DQS control signal, the fourth DQS control signal being generated by latching the third DQS control signal and by delaying the third DQS control signal for a second delay time.

A semiconductor device and a semiconductor memory device having an interface of an open drain type or a pseudo open drain type may be manufactured so as to have the above features. For example, DDR 3 SDRAM (Synchronous DRAM) may be manufactured.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 14 is a timing diagram illustrating a preamble section and a postamble section of a DQS output circuit according to further embodiments of the present invention.

DESCRIPTION OF EMBODIMENTS

Figure 1:
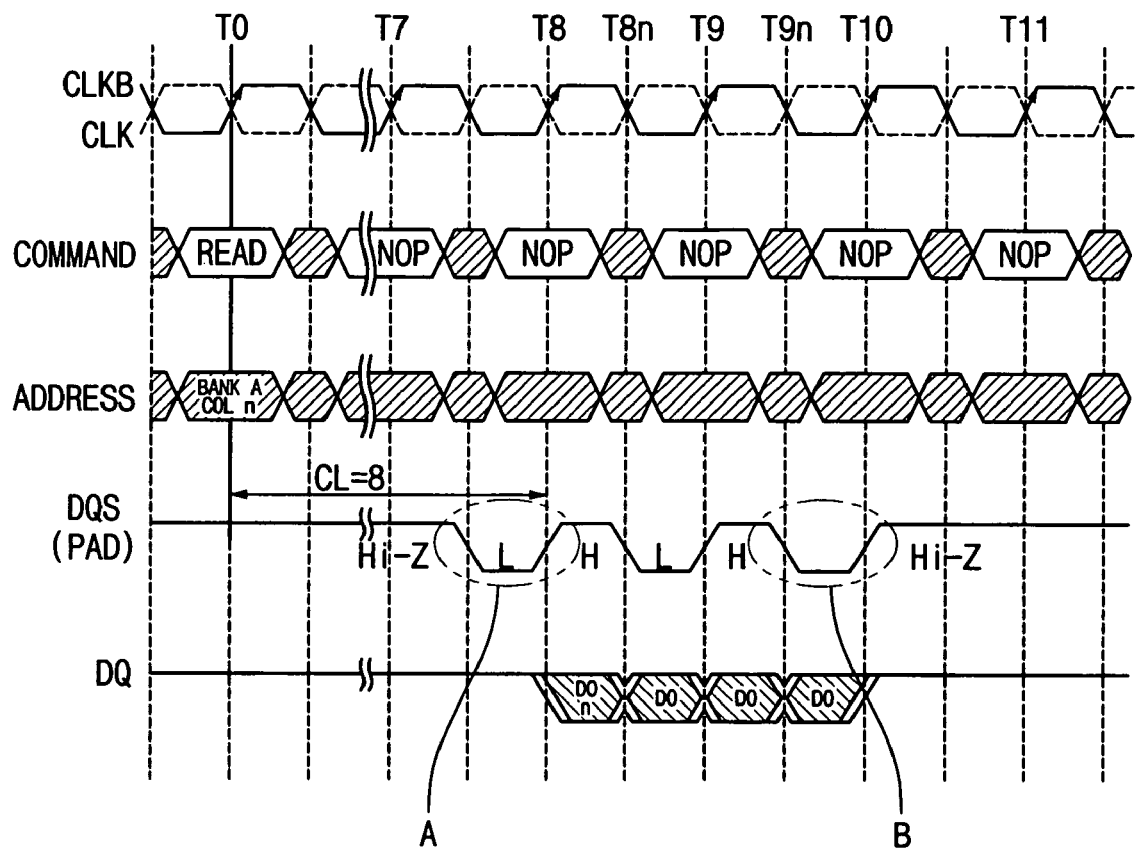
FIG. 1 is a timing diagram illustrating a preamble section and a postamble section of a data strobe (DQS) in a common double data rate 3 (DDR3) memory.
Figure 2:
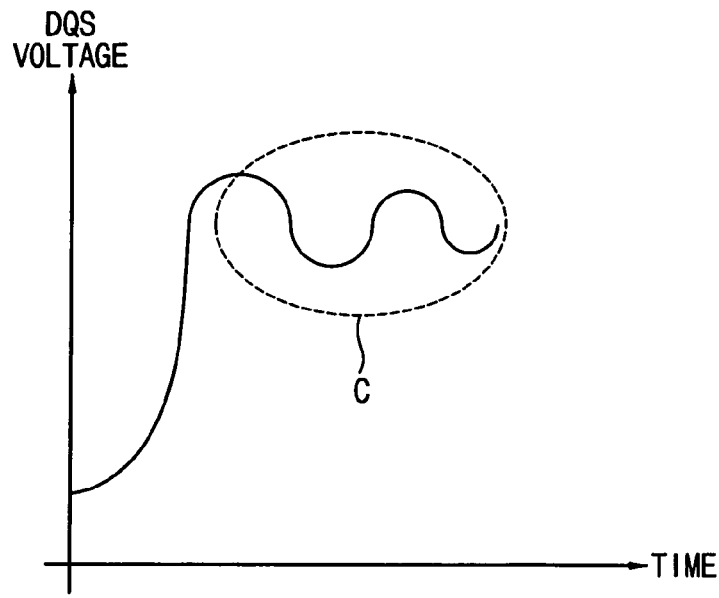
FIG. 2 is a graph illustrating a ringing effect.
Figure 3:
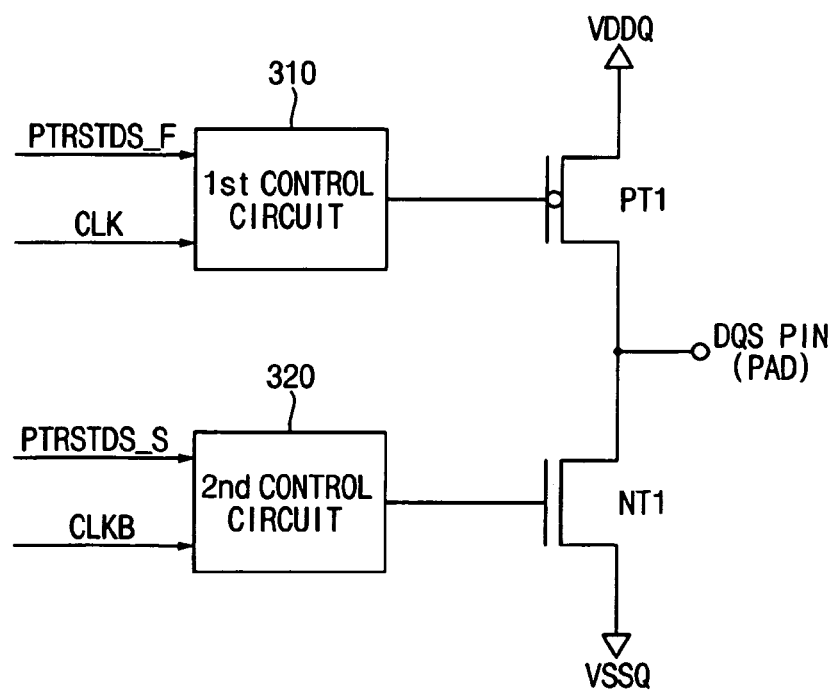
FIG. 3 is a block diagram illustrating a DQS output circuit of a conventional memory device.
Figure 4:
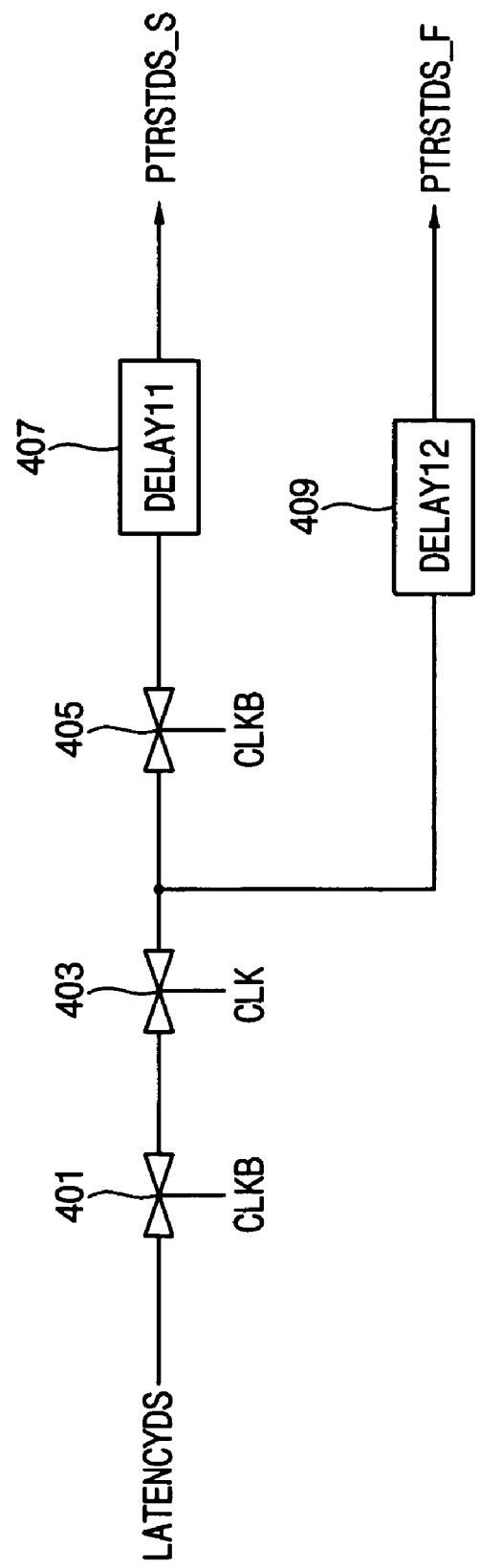
FIG. 4 is a block diagram illustrating a DQS control signal generating circuit of a conventional memory device.
Figure 5:
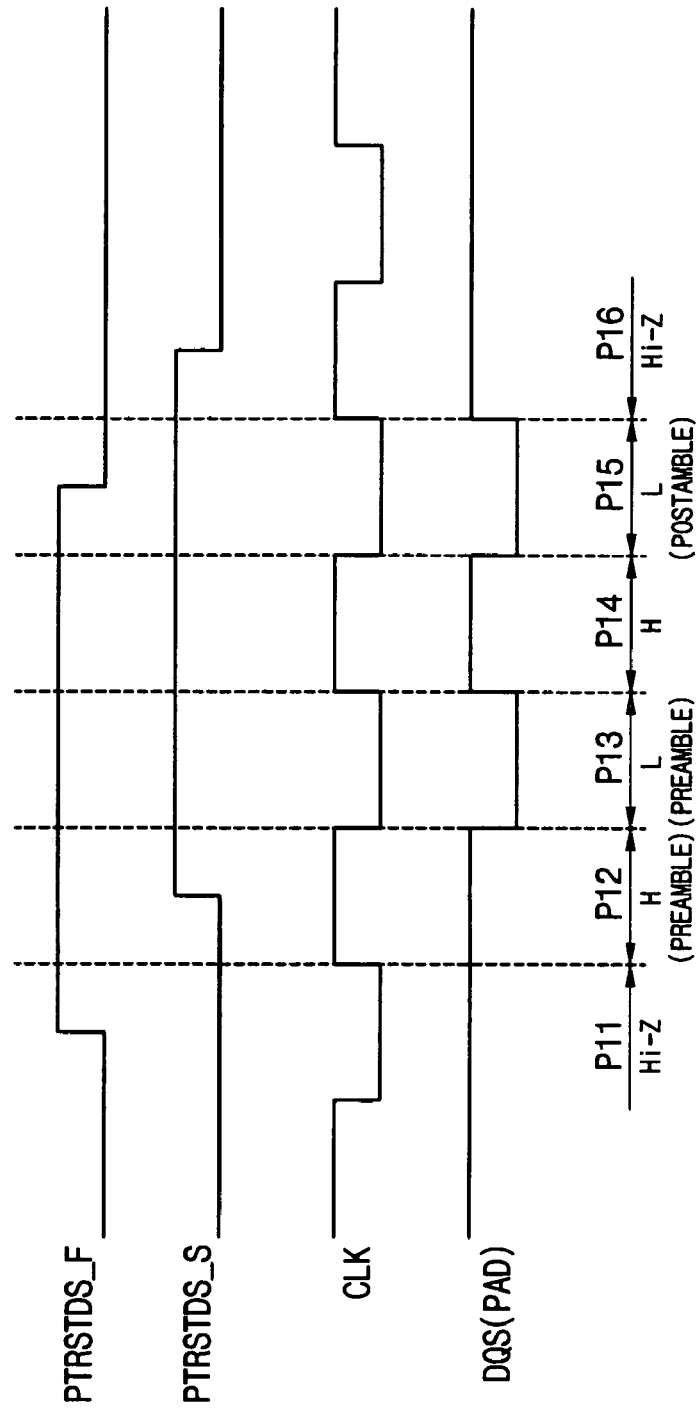
FIG. 5 is a timing diagram illustrating a preamble section and a postamble section of a DQS output circuit of a conventional memory device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

According to some embodiments of the present invention, a low state L of a postamble section of a data strobe signal DQS is not changed directly to a high impedance state Hi-Z, but sequentially changed to a high state H, and then to the high impedance state Hi-Z, so that a ringing effect of a DQS pin may be removed or reduced.

Table 2 illustrates a state of the DQS pin in the postamble section of the data strobe signal DQS and a following section next to the postamble section according to some embodiments of the present invention.

TABLE 2

|  | Low Section of CLK (Postamble Section) | High Section of Next CLK (Following Section Next to Postamble Section) | Low Section of Next CLK (Following Section Next to Postamble Section) |
|---|---|---|---|
| DQS Output State | L | H (VDDQ) | Hi-Z |
| DQS Pin Level | L | VDDQ | VDDQ |

As described above, when the low state of the postamble section of the data strobe signal DQS is not changed directly to the high impedance state Hi-Z, but sequentially changed to the high state H, and then to the high impedance state Hi-Z, an impedance matching condition is maintained while the data strobe signal DQS changes from the low state L to the high state H, so the ringing effect does not occur.

Figure 6:
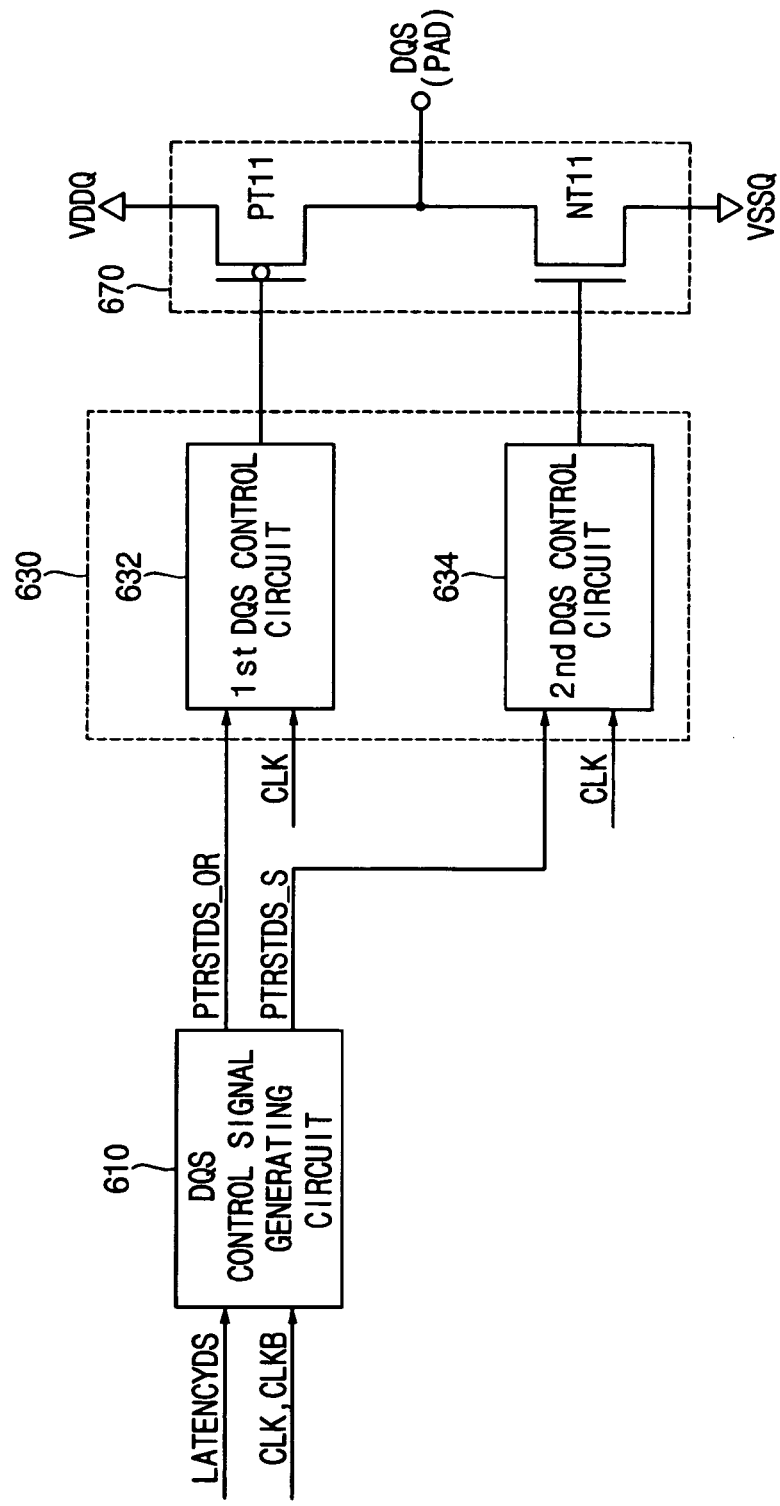
FIG. 6 is a block diagram illustrating a DQS output circuit according to some embodiments of the present invention.
Figure 7:
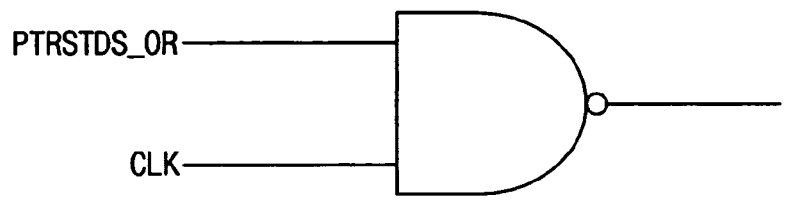
FIG. 7 is a circuit diagram illustrating a first DQS control circuit of FIG. 6 according to some embodiments of the present invention.
Figure 8:
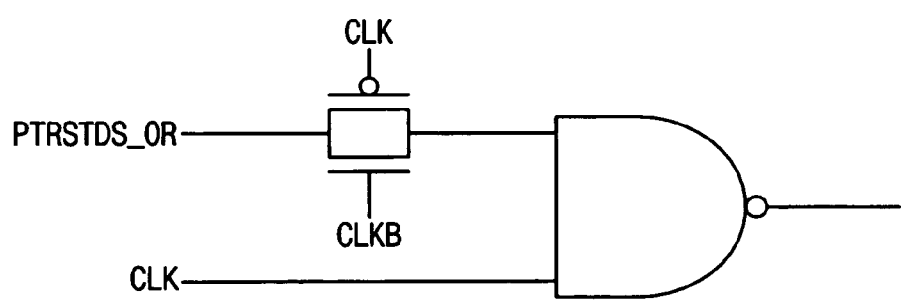
FIG. 8 is a circuit diagram illustrating a first DQS control circuit of FIG. 6 according to further embodiments of the present invention.
Figure 9:
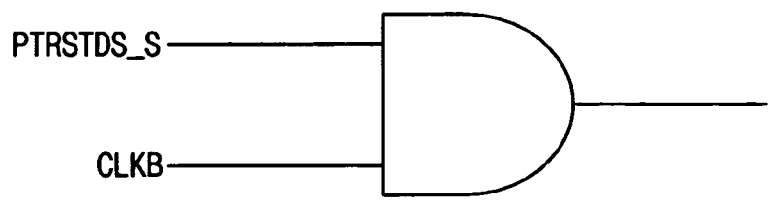
FIG. 9 is a circuit diagram illustrating a second DQS control circuit of FIG. 6 according to further embodiments of the present invention.
Figure 10:
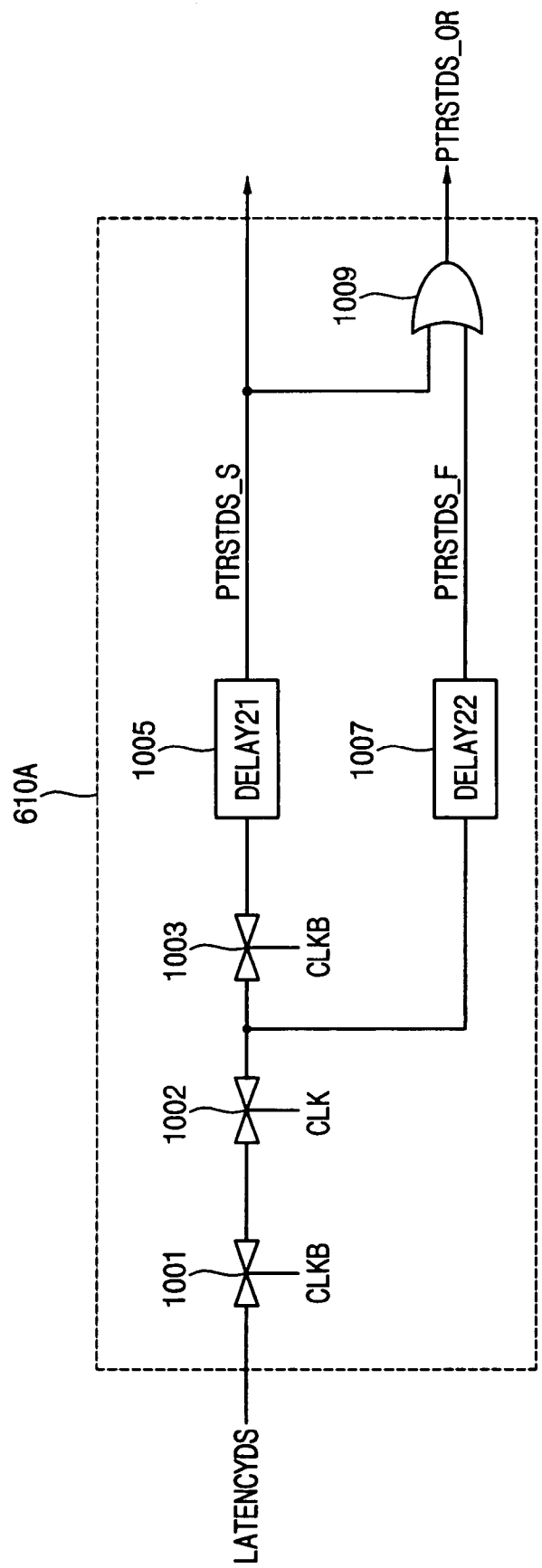
FIG. 10 is a circuit diagram illustrating a DQS control signal generating circuit of FIG. 6 according to some embodiments of the present invention.
Figure 11:
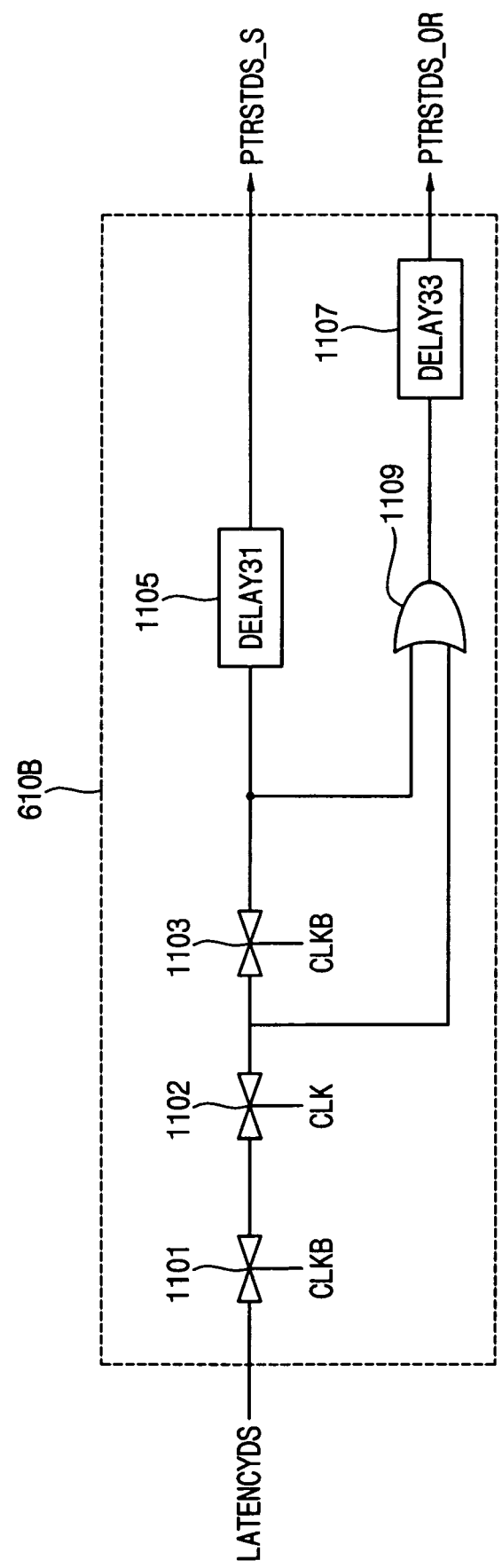
FIG. 11 is a circuit diagram illustrating a DQS control signal generating circuit of FIG. 6 according to some embodiments of the present invention.
Figure 12:
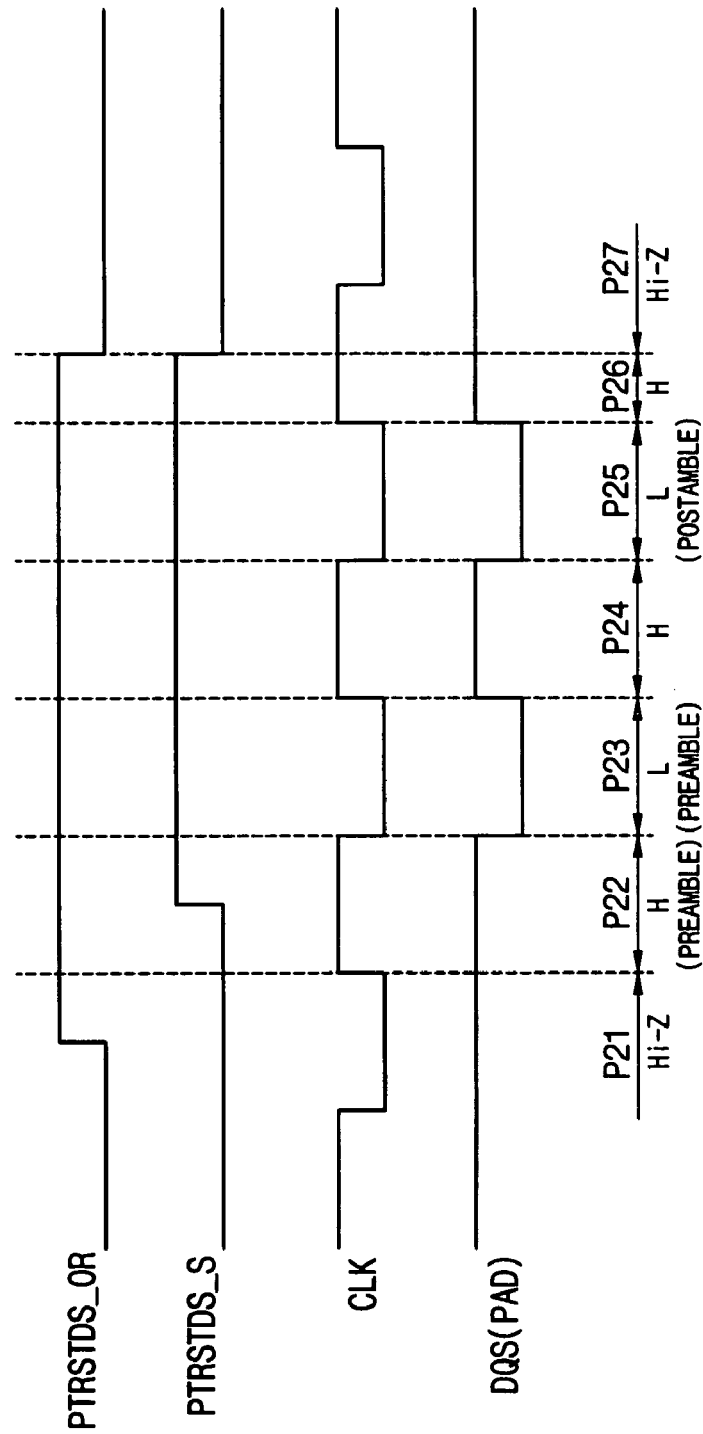
FIG. 12 is a timing diagram illustrating a preamble section and a postamble section of a DQS output circuit according to some embodiments of the present invention.

FIG. 6 is a block diagram illustrating a DQS output circuit according to some embodiments of the present invention. FIG. 7 and FIG. 8 are circuit diagrams illustrating a first DQS control circuit in FIG. 6 according to some embodiments of the present invention. FIG. 9 is a circuit diagram illustrating a second DQS control circuit of FIG. 6 according to further embodiments of the present invention. FIGS. 10 and 11 are circuit diagrams illustrating a DQS control signal generating circuit of FIG. 6 according to some embodiments of the present invention. FIG. 12 is a timing diagram illustrating a preamble section and a postamble section of a DQS output circuit according to some embodiments of the present invention.

Referring to FIG. 6, the DQS output circuit includes a DQS control signal generating circuit 610, a DQS control circuit 630 and an output unit. The DQS control circuit 630 includes a first DQS control circuit 632 and a second DQS control circuit 634. The output unit 670 includes a PMOS transistor PT11 and an NMOS transistor NT11.

The DQS control signal generating circuit 610 generates a first DQS control signal PTRSTDS_OR and a second DQS control signal PTRSTDS_S in response to a third DQS control signal LATENCYDS, a clock signal CLK and an inverted clock signal CLKB. Alternatively, the DQS control signal generating circuit 610 may generate the first DQS control signal PTRSTDS_OR and the second DQS control signal PTRSTDS_S by producing the inverted clock signal CLKB within the DQS control circuit itself using the clock signal CLK. The signal LATENCYDS is a DQS control signal, which controls an output timing of READ data according to a column address strobe latency (CL). The first DQS control signal PTRSTDS_OR and the second DQS control signal PTRSTDS_S are DQS control signals, which are used for toggling the data strobe signal DQS in a READ operation. For example, the second DQS control signal PTRSTDS_S may be delayed by a ½ period of the clock signal CLK with respect to the second DQS control signal PTRSTDS_S.

The first DQS control circuit 632 operates in response to the first DQS control signal PTRSTDS_OR and the clock signal CLK, so that a following section next to the postamble section of the data strobe signal DQS, through a DQS pin of the output unit 670, may be maintained in a second logic state (for example, a high level) as shown in sections P22, P24 and P26 of FIG. 12. More specifically, when the first DQS control signal PTRSTDS_OR is in a activated state (for example, a high level) and the clock signal CLK is in a activated state (for example, a high level), the first DQS control circuit 632 turns on the PMOS transistor PT11 of the output unit 670 to maintain the second logic level (for example, a high level) during the following section next to the postamble section of the data strobe signal DQS through the DQS pin of the output unit 670.

The first DQS control circuit 632 may be realized by using a NAND gate.

Referring to FIG. 7, the first DQS control circuit 632 executes a NAND operation of the first DQS control signal PTRSTDS_OR and the clock signal CLK that are inputted to the NAND gate, and provides a result of the NAND operation to a gate of the PMOS transistor PT11 of the output unit 670.

In addition, for an operation at a high frequency, the first DQS control circuit 632 may fetch the first DQS control signal PTRSTDS_OR during a low section of the clock signal CLK, and may provide the result of the NAND operation to the gate of PT11 of the output unit 670 during a high section of the clock signal CLK.

Referring to FIG. 8, the first DQS control circuit 632 may fetch the first DQS control signal PTRSTDS_OR during a low section of the clock signal CLK by using a transmission gate, and may provide the result of the NAND operation to the gate of PT11 of the output unit 670 during a high section of the clock signal CLK by receiving results of the fetched signal and the clock signal CLK as inputs to the NAND gate.

Referring again to FIG. 6, the second DQS control circuit 634 operates in response to the second DQS control signal PTRSTDS_S and the clock signal CLK, so that the postamble section of the data strobe signal DQS, through the DQS pin of the output unit 670, may be maintained in a first logic state (for example, a low level). More specifically, when the second DQS control signal PTRSTDS_S is in an activated state (for example, a high level) and the clock signal CLK is in an inactivated state (for example, a low level) as shown in sections P23 and P25 of FIG. 12, the second DQS control circuit 634 turns on the NMOS transistor NT11 of the output unit 670 to maintain the first logic level (for example, a low level) of the postamble section of the data strobe signal DQS through the DQS pin of the output unit 670.

The second DQS control circuit 634 may be realized by using an AND gate.

Referring to FIG. 9, the second DQS control circuit 634 executes an AND operation of the second DQS control signal PTRSTDS_S and the inverted clock signal CLKB that are inputted to the AND gate, and provides a result of the AND operation to a gate of the NMOS transistor NT11 of the output unit 670.

Referring again to FIG. 6, the output unit 670 includes the PMOS transistor PT11 coupled to a first power voltage VDDQ, and the NMOS transistor NT11 coupled to a second power voltage VSSQ. The data strobe signal DQS is outputted through a drain of the NMOS transistor NT11.

Referring to FIG. 10, the DQS control signal generating circuit 610A includes a plurality of latches 1001, 1002 and 1003, delay circuits 1005 and 1007, and an OR gate 1009.

The DQS control signal LATENCYDS is latched through the latches 1001, 1002 and 1003 in response to the clock signal CLK and the inverted clock signal CLKB. The second DQS control signal PTRSTDS_S is generated by delaying an output of the latch 1003 for a first delay time through a first delay circuit 1005. The latches 1001, 1002 and 1003 may operate to respectively cause a delay of a ½ period of the clock signal CLK.

In addition, the DQS control signal LATENCYDS is latched through the latches 1001 and 1002 in response to the clock signal CLK and the inverted clock signal CLKB. A fourth DQS control signal PTRSTDS_F is generated by delaying an output of the latch 1002 for a second delay time through a second delay circuit 1007. The first delay time and the second delay time are substantially equal. The latch 1003 causes a delay of a ½ period of the clock signal CLK so that the second DQS control signal PTRSTDS_S is delayed by a ½ period of the clock signal CLK with respect to the fourth DQS control signal PTRSTDS_F.

The OR gate 1009 generates the first DQS control signal PTRSTDS_OR by executing an OR operation of the second DQS control signal PTRSTDS_S and the fourth DQS control signal PTRSTDS_F.

According to some embodiments of the present invention as shown in FIG. 11, an OR gate may be placed before a first delay circuit and a second delay circuit.

Referring to FIG. 11, the DQS control signal generating circuit 610B includes a plurality of latches 1101, 1102 and 1103, delay circuits 1105 and 1107, and an OR gate 1109.

The DQS control signal LATENCYDS is latched through the latches 1101, 1102 and 1103 in response to the clock signal CLK and the inverted clock signal CLKB. The latches 1101, 1102 and 1103 may operate to respectively cause a delay of a ½ period of the clock signal CLK.

The second DQS control signal PTRSTDS_S is generated by delaying an output of the latch 1103 for a first delay time through a first delay circuit 1105.

The OR gate 1109 executes an OR operation of an output of the latch 1102 and an output of latch 1103. The second delay circuit 1107 generates the first DQS control signal PTRSTDS_OR by delaying an output of the OR gate 1109 for a third delay time.

Referring to FIG. 12, after section P21 of a high impedance state Hi-Z, when the first DQS control signal PTRSTDS_OR and the clock signal CLK have a high level, the PMOS transistor PT11 of FIG. 6 is turned on and a DQS output at the DQS pin (PAD) has a high level H in preamble section P22 of the data strobe signal DQS. When the second DQS control signal PTRSTDS_S has a high level and the clock signal CLK has a low level, the NMOS transistor NT11 of FIG. 6 is turned on and the DQS output at the DQS pin (PAD) has a low level L in section P23.

After preamble sections P22 and P23, when the first DQS control signal PTRSTDS_OR and the clock signal CLK have a high level, the DQS output has a high level H in data output section P24. After the data output section P24, when the second DQS control signal PTRSTDS_S has a high level and the clock signal CLK has a low level, the DQS output has a low level L in postamble section P25.

After postamble section P25, when the signal CLK has a high level, the DQS output may have a high level H instead of a high impedance state Hi-Z in the following section P26 next to postamble section P25 by causing the first DQS control signal PTRSTDS_OR to have a high level.

Next, when the first DQS control signal PTRSTDS_OR and the second DQS control signal PTRSTDS_S have a low level and the first DQS control circuit 632 and the second DQS control circuit 634 do not operate, the PMOS transistor PT11 and the NMOS transistor NT11 are turned off and the DQS output at the DQS pin (PAD) has a high impedance state Hi-Z in section P27.

Figure 13:
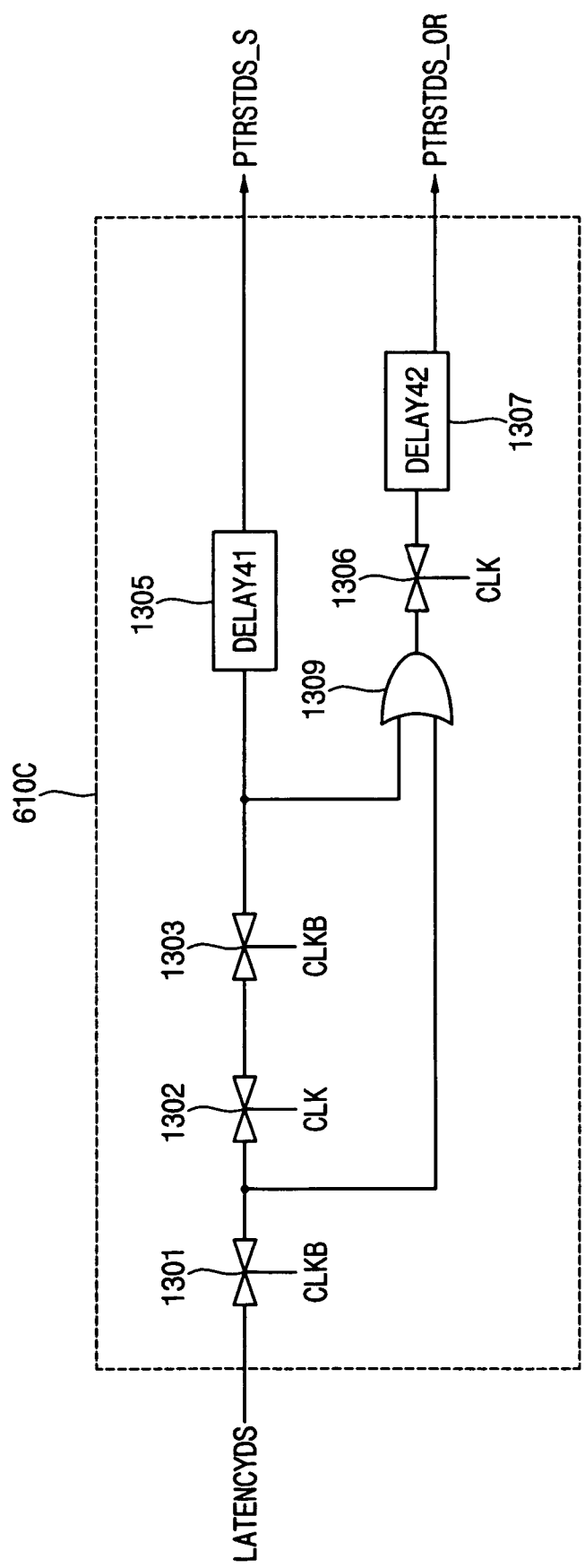
FIG. 13 is a circuit diagram illustrating a DQS control signal generating circuit of FIG. 6 according to further embodiments of the present invention.

FIG. 13 is a circuit diagram illustrating a DQS control signal generating circuit of FIG. 6 according to further embodiments of the present invention. Referring to FIG. 13, the DQS control signal generating circuit 610C includes a plurality of latches 1301, 1302 1303 and 1306, delay circuits 1305 and 1307, and an OR gate 1309.

The DQS control signal LATENCYDS is latched through the latches 1301, 1302 and 1303 in response to the clock signal CLK and the inverted clock signal CLKB. The second DQS control signal PTRSTDS_S is generated by delaying an output of the latch 1303 for a first delay time through a first delay circuit 1305. The latches 1301, 1302 and 1303 may operate to respectively cause a delay of a ½ period of the clock signal CLK.

The OR gate 1309 executes an OR operation of an output of the latch 1301 and an output of the latch 1303. An output of the OR gate 1309 is latched by the latch 1306. The first DQS control signal PTRSTDS_OR is generated by delaying an output of the latch 1306 for a fourth delay time through the fourth delay circuit 1307. The fourth delay time and the first delay time are substantially equal. The latch 1306 causes a delay of a ½ period of the clock signal CLK so that the first DQS control signal PTRSTDS_OR is delayed by a ½ period of the clock signal CLK with respect to the second DQS control signal PTRSTDS_S.

An operation at a high frequency may be possible by controlling, using the latch 1306, a length of a section in which the first DQS control signal PTRSTDS_OR has an activated level.

FIG. 14 is a timing diagram illustrating a preamble section and a postamble section for a DQS output circuit according to further embodiments of the present invention.

When FIG. 14 is compared with FIG. 12, preamble sections P22 and P23, data output section P24 and postamble section P25 are all the same. However, a section P36 of a high level H, which precedes section P37 of a high impedance state Hi-Z, is prolonged compared to section P26 of FIG. 12. That is, the length of the high level section of the first DQS control signal PTRSTDS_OR may be increased by using the latch 1306.

According to some embodiments of the present invention, a low level L of a postamble section of a data strobe signal DQS is not changed directly to a high impedance state Hi-Z, but sequentially changed to a high state H, and then to the high impedance state Hi-Z, so that a ringing effect of a DQS pin may be removed or reduced.

Therefore, a ringing effect that occurs in a postamble section of a data strobe signal DQS may be reduced, thereby providing a stable data strobe signal.

In addition, an operation at a high frequency may be performed by controlling a section length corresponding to a high level before a high impedance level in a following section next to a postamble section of the data strobe signal DQS.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device having an interface of an open drain type or a pseudo-open drain type, the semiconductor device comprising:

a data strobe (DQS) control signal generating circuit configured to generate a first DQS control signal and a second DQS control signal;

a DQS control circuit configured to control a data strobe signal DQS by sequentially changing a state of a following section next to a postamble section of the data strobe signal DQS in response to a clock signal, the first DQS control signal and the second DQS control signal, sequentially from a first logical state of the postamble section to a second logical state, and from the second logical state to a high impedance state after a first predetermined time wherein the second logical state is different than the high impedance state; and an output unit configured to output the data strobe signal DQS.

2. The semiconductor device of claim 1, wherein the first DQS control signal is activated for a second predetermined time while the clock signal is activated during the following section next to the postamble section.

3. The semiconductor device of claim 2, wherein the DQS control signal generating circuit configured to generate the second DQS control signal by latching a third DQS control signal in response to the clock signal and an inverted clock signal having an inverted phase with respect to the clock signal, and then by delaying the third DQS control signal for a first delay time.

4. The semiconductor device of claim 3, wherein the first DQS control signal is generated by executing an OR operation of the second DQS control signal and a fourth DQS control signal, the fourth DQS control signal being generated by latching the third DQS control signal and by delaying the third DQS control signal for a second delay time.

5. The semiconductor device of claim 3, wherein the first predetermined time corresponds to a half period of the clock signal.

6. The semiconductor device of claim 5, wherein the DQS control signal generating circuit comprises:
    a first latch configured to Latch the third DQS control signal;
    a second latch configured to latch an output of the first latch;
    a third latch configured to latch an output of the second latch; and
    a first delay circuit configured to delay an output of the third latch for the first delay time to output the second DQS control signal.

7. The semiconductor device of claim 6, wherein the DQS control signal generating circuit further comprises:
    a second delay circuit configured to delay the output of the second latch for a second delay time to output a fourth DQS control signal; and
    an OR gate executing an OR operation of the second DQS control signal and the fourth DQS control signal to output the first DQS control signal.

8. The semiconductor of claim 6, wherein the DQS control signal generating circuit further comprises:
    an OR gate executing an OR operation of the output of the second latch and the output of the third latch; and
    a second delay circuit configured to delay an output of the OR gate for a second delay time to output the first DQS control signal.

9. The semiconductor device of claim 6, wherein the DQS control signal generating circuit further comprises:
    an OR gate executing an OR operation of the output of the first latch and the output of the third latch;
    a fourth latch configured to latch an output of the OR gate; and
    a second delay circuit configured to delay an output of the fourth latch for a second delay time to output the first DQS control signal.

10. The semiconductor device of claim 3, wherein the first predetermined time is greater than a half period of the clock signal.

11. The semiconductor device of claim 2, wherein the DQS control circuit comprises:
    a first DQS control circuit configured to maintain the second logic state of the postamble section of the data strobe signal while both the first DQS control signal is activated and the clock signal is activated; and
    a second DQS control circuit configured to maintain the first logic state of the postamble section of the data strobe signal while the second DQS control signal is activated and the clock signal is not activated.

12. The semiconductor device of claim 11, wherein the first DQS control circuit comprises a NAND gate configured to execute a NAND operation of the first DQS control signal and the clock signal.

13. The semiconductor device of claim 11, wherein the first DQS control circuit comprises:
    a transmission gate configured to transmit the first DQS control signal in response to an inverted clock signal having an inverted phase with respect to the clock signal; and
    a NAND gate configured to execute a NAND operation of the clock signal and an output of the transmission gate.

14. The semiconductor device of claim of 12, wherein the second DQS control circuit comprises an AND gate configured to execute an AND operation of the first DQS control signal and an inverted clock signal having an inverted phase with respect to the clock signal.

15. The semiconductor device of claim 1, the semiconductor device corresponds to a double data rate 3 (DDR3) memory device.

16. A semiconductor memory device having an interface of an open drain type or a pseudo-open drain type, the semiconductor device comprising:
    a data strobe (DQS) control circuit configured to control a data strobe signal by sequentially changing a state of a following section next to a postamble section of the data strobe signal in response to a clock signal, the first DQS control signal and the second DQS control signal, sequentially from a first logical state of the postamble section to a second logical state, and from the second logical state to a high impedance state after a first predetermined time wherein the second logical state is different than the high impedance state; and
    an output unit configured to output the data strobe signal.

17. The semiconductor memory device of claim 16, further comprising a DQS control signal generating circuit configured to generate a first DQS control signal and a second DQS control signal, wherein the first DQS control signal is activated for a second predetermined time while the clock signal is activated during the following section next to the postamble section.

18. The semiconductor memory device of claim 17, wherein the DQS control signal generating circuit latches a third DQS control signal in response to the clock signal and an inverted clock signal having an inverted phase with respect to the clock signal, and outputs the second DQS control signal by delaying the third DQS control signal for a first delay time.

19. The semiconductor memory device of claim 18, wherein the first DQS control signal is generated by executing an OR operation of the second DQS control signal and a fourth DQS control signal, the fourth DQS control signal being generated by latching the third DQS control signal and by delaying the third DQS control signal for a second delay time.

20. A method of controlling a data strobe (DQS) in a semiconductor device having an interface of an open drain type or a pseudo-open drain type, the method comprising:
    generating a first DQS control signal that is activated for a second predetermined time while the clock signal is activated during a following section next to a postamble section of a data strobe signal;
    generating a second DQS control signal;
    changing a state of the following section next to the postamble section of the data strobe signal in response to a clock signal, the first DQS control signal and the second DQS control signal, sequentially from a first logical state of the postamble section to a second logical state; and
    changing the state of the following section next to the postamble section of the data strobe signal sequentially from the second logical state to a high impedance state after a first predetermined time wherein the second logical state is different than the high impedance state.

21. The method of claim 20, wherein generating a second DQS control signal corresponds to generating the second DQS control signal by latching a third DQS control signal in response to the clock signal and an inverted clock signal having an inverted phase with respect to the clock signal, and then by delaying the third DQS control signal for a first delay time.

22. The method of claim 21, wherein the first DQS control signal is generated by executing an OR operation of the second DQS control signal and a fourth DQS control signal, the fourth DQS control signal being generated by latching the third DQS control signal and by delaying the third DQS control signal for a second delay time.

23. A semiconductor device having an interface of an open drain type or a pseudo-open drain type, the semiconductor device comprising:
    a data strobe (DQS) control signal generating circuit configured to generate a first DQS control signal and a second DQS control signal;
    a DQS control circuit configured to control a data strobe signal DQS by sequentially changing a state of a following section next to a postamble section of the data strobe signal DQS in response to a clock signal, the first DQS control signal and the second DQS control signal, from a first logical state of the postamble section to a second logical state, and from the second logical state to a high impedance state after a first predetermined time wherein the second logical state is different than the high impedance state; and
    an output unit configured to output the data strobe signal DQS,
    wherein the first DQS control signal is activated for a second predetermined time while the clock signal is activated during the following section next to the postamble section,
    wherein the DQS control signal generating circuit configured to generate the second DQS control signal by latching a third DQS control signal in response to the clock signal and an inverted clock signal having an inverted phase with respect to the clock signal, and then by delaying the third DQS control signal for a first delay time, and
    wherein the first DQS control signal is generated by executing an OR operation of the third DQS control signal and a fourth DQS control signal, the fourth DQS control signal being generated by latching the second DQS control signal and by delaying the third DQS control signal for a second delay time.

24. A semiconductor device having an interface of an open drain type or a pseudo-open drain type, the semiconductor device comprising:
    a data strobe (DQS) control signal generating circuit configured to generate a first DQS control signal and a second DQS control signal;
    a DQS control circuit configured to control a data strobe signal DQS by sequentially changing a state of a following section next to a postamble section of the data strobe signal DQS in response to a clock signal, the first DQS control signal and the second DQS control signal, from a first logical state of the postamble section to a second logical state, and from the second logical state to a high impedance state after a first predetermined time wherein the second logical state is different than the high impedance state; and
    an output unit configured to output the data strobe signal DQS,
    wherein the first DQS control signal is activated for a second predetermined time while the clock signal is activated during the following section next to the postamble section,
    wherein the DQS control signal generating circuit configured to generate the second DQS control signal by latching a third DQS control signal in response to the clock signal and an inverted clock signal having an inverted phase with respect to the clock signal, and then by delaying the third DQS control signal for a first delay time,
    wherein the first predetermined time corresponds to a half period of the clock signal, and
    wherein the DQS control signal generating circuit comprises:
        a first latch configured to latch the third DQS control signal;
        a second latch configured to latch an output of the first latch;
        a third latch configured to latch an output of the second latch; and
        a first delay circuit configured to delay an output of the third latch for the first delay time to output the second DQS control signal.

25. The semiconductor device of claim 24, wherein the DQS control signal generating circuit further comprises:
    a second delay circuit configured to delay the output of the second latch for a second delay time to output a fourth DQS control signal; and
    an OR gate executing an OR operation of the second DQS control signal and the fourth DQS control signal to output the first DQS control signal.

26. The semiconductor of claim 24, wherein the DQS control signal generating circuit further comprises:
    an OR gate executing an OR operation of the output of the second latch and the output of the third latch; and
    a second delay circuit configured to delay an output of the OR gate for a second delay time to output the first DQS control signal.

27. The semiconductor device of claim 24, wherein the DQS control signal generating circuit further comprises:
    an OR gate executing an OR operation of the output of the first latch and the output of the third latch;
    a fourth latch configured to latch an output of the OR gate; and
    a second delay circuit configured to delay an output of the fourth latch for a second delay time to output the first DQS control signal.

28. A semiconductor device having an interface of an open drain type or a pseudo-open drain type, the semiconductor device comprising:
    a data strobe (DQS) control signal generating circuit configured to generate a first DQS control signal and a second DQS control signal;
    a DQS control circuit configured to control a data strobe signal DQS by sequentially changing a state of a following section next to a postamble section of the data strobe signal DQS in response to a clock signal, the first DQS control signal and the second DQS control signal, from a first logical state of the postamble section to a second logical state, and from the second logical state to a high impedance state after a first predetermined time wherein the second logical state is different than the high impedance state; and
    an output unit configured to output the data strobe signal DQS,
    wherein the first DQS control signal is activated for a second predetermined time while the clock signal is activated during the following section next to the postamble section,
    wherein the DQS control circuit comprises:

a first DQS control circuit configured to maintain the second logic state of the postamble section of the data strobe signal while both the first DQS control signal is activated and the clock signal is activated; and a second DQS control circuit configured to maintain the first logic state of the postamble section of the data strobe signal while the second DQS control signal is activated and the clock signal is not activated, wherein the first DQS control circuit comprises a NAND gate configured to execute a NAND operation of the first DQS control signal and the clock signal, and wherein the second DQS control signal comprises an AND gate configured to execute an AND operation of the first DQS control circuit and an inverted clock signal having an inverted phase with respect to the clock signal.

29. A method of controlling a data strobe (DQS) in a semiconductor device having an interface of an open drain type or a pseudo-open drain type, the method comprising:

generating a first DQS control signal that is activated for a second predetermined time while the clock signal is activated during a following section next to a postamble section of a data strobe signal;

generating a second DQS control signal;

changing a state of the following section next to the postamble section of the data strobe signal in response to a clock signal, the first DQS control signal and the second DQS control signal, from a first logical state of the postamble section to a second logical state; and changing the state of the following section next to the postamble section of the data strobe signal from the second logical state to a high impedance state after a first predetermined time wherein the second logical state is different than the high impedance state, wherein generating a second DQS control signal corresponds to generating the second DQS control signal by latching a third DQS control signal in response to the clock signal and an inverted clock signal having an inverted phase with respect to the clock signal, and then by delaying the third DQS control signal for a first delay time, wherein the first DQS control signal is generated by executing an OR operation of the third DQS control signal and a fourth DQS control signal, the fourth DQS control signal being generated by latching the second DQS control signal and by delaying the third DQS control signal for a second delay time.

* * * * *

UNITED STATES PATENT AND TRADEMARK OFFICE
CERTIFICATE OF CORRECTION

PATENT NO. : 7,460,417 B2 Page 1 of 1
APPLICATION NO. : 11/371831
DATED : December 2, 2008
INVENTOR(S) : Joung-Yeal Kim et al.

It is certified that error appears in the above-identified patent and that said Letters Patent is hereby corrected as shown below:

Column 11, line 12 claim 6 delete "Latch" and insert --latch--

Column 13, line 40 claim 23 delete "third" and insert --second--

Column 13, line 42 claim 23 delete "second" and insert --third--

Column 16, line 19 claim 29 delete "third" and insert --second--

Signed and Sealed this

Thirty-first Day of March, 2009

JOHN DOLL
*Acting Director of the United States Patent and Trademark Office*